(12) United States Patent
Koch, II et al.

(10) Patent No.: US 6,759,880 B2
(45) Date of Patent: *Jul. 6, 2004

(54) DRIVER CIRCUIT CONNECTED TO A SWITCHED CAPACITOR AND METHOD OF OPERATING SAME

(75) Inventors: Kenneth Koch, II, Ft. Collins, CO (US); Mozammel Hossain, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/167,507

(22) Filed: Jun. 13, 2002

(65) Prior Publication Data

US 2003/0231033 A1 Dec. 18, 2003

(51) Int. Cl.[7] .................................................. H03B 1/00
(52) U.S. Cl. ........................ 327/112; 327/108; 326/83
(58) Field of Search .......................... 327/108–112, 170, 327/263, 268, 376, 377, 389, 391, 427, 285, 288, 265; 326/20, 23, 24, 26, 27, 83, 87

(56) References Cited

U.S. PATENT DOCUMENTS

| | | | |
|---|---|---|---|
| 4,430,587 A | 2/1984 | Tennyson | 327/281 |
| 4,617,529 A | 10/1986 | Suzuki | 331/57 |
| 4,622,482 A | 11/1986 | Ganger | 327/427 |
| 4,739,189 A | 4/1988 | Kellogg | 327/550 |
| 5,041,741 A | 8/1991 | Steele | 326/83 |
| 5,068,553 A | 11/1991 | Love | 327/288 |
| 5,280,420 A | 1/1994 | Rapp | 363/60 |
| 5,324,999 A | 6/1994 | Hunley et al. | 327/379 |
| 5,479,132 A | 12/1995 | Verhaeghe et al. | 327/553 |
| 5,633,600 A | 5/1997 | Ohnishi | 326/17 |
| 5,694,065 A | 12/1997 | Hamasaki et al. | 327/108 |
| 5,929,681 A | 7/1999 | Suzuki | 327/284 |
| 6,121,813 A | 9/2000 | Furuchi | 327/285 |

*Primary Examiner*—Terry D. Cunningham
*Assistant Examiner*—Long Nguyen

(57) ABSTRACT

An integrated circuit driver includes an output stage having source drain paths of PFET and NFET connected in series with each other across DC power supply terminals. A pair of CMOS inverters simultaneously responsive to a bilevel signal drive gate electrodes of the PFET and NFET. The inverters include resistors connected to NFET and PFET devices which function as voltage controlled switched capacitors respectively connected in shunt with gate electrodes of the output stage PFET and NFET. The inverters, resistors and capacitors prevent the output stage PFET and NFET from being on simultaneously

5 Claims, 2 Drawing Sheets

DRIVER CIRCUIT CONNECTED TO A SWITCHED CAPACITOR AND METHOD OF OPERATING SAME

FIELD OF THE INVENTION

The present invention relates generally to driver circuits and methods of operating them and, more particularly, to a driver circuit including first and second opposite conductivity type transistors which are prevented from conducting simultaneously in response to a transition between first and second voltage levels of a bilevel source by circuitry including a switched capacitor.

BACKGROUND ART

One type of driver circuit that is frequently employed, particularly on integrated circuit chips, includes first and second opposite conductivity type transistors, each including a control electrode and a path which is switched on and off between a pair of further electrodes. Each path is switched on and off in response to a voltage applied to the control electrode of the particular transistor being on opposite sides of a threshold. The paths of the first and second transistors are connected in series across terminals of a DC power supply. An output terminal between the series connected paths drives a load.

In a typical integrated circuit chip, the transistors are opposite conductivity type metal oxide semiconductor field effect transistors (MOSFETs), wherein the control electrodes are gate electrodes and the further electrodes are source and drain electrodes. Such a driver includes a positive channel field effect transistor (PFET) and a negative channel field effect transistor (NFET). The switched path between the source and drain electrodes of each field effect transistor (FET) is frequently referred to as a source drain path and the source drain paths of the PFET and NFET are connected in series across opposite polarity terminals of the power supply.

The typical integrated circuit chip includes many such drivers that are responsive to bilevel sources having positive and negative going transitions between first and second voltage levels that are usually approximately equal to the voltages at the power supply terminals. The bilevel sources can be either data or clock sources. In response to the bilevel source being at the first (low) voltage level, the PFET and NFET are respectively on and off, while the NFET and PFET are respectively on and off in response to the bilevel source being at the second (high) voltage level. A relatively high impedance is provided by the source drain path of the NFET or PFET which is off so that substantial current does not flow through both the PFET and NFET of the driver while the bilevel source is at the first and second voltage levels. To minimize power consumption, the PFET and NFET should not be on at the same time during the transitions.

Many of the drivers of the foregoing type on a typical integrated circuit chip are simultaneously responsive to the transitions. If many of the drivers of the foregoing type are simultaneously responsive to the transitions and if the PFET and NFET of each of these drivers were on at the same time during the transitions, a substantial amount of current, frequently referred to as crow bar current would be drawn from the power supply. The current could be so great as to cause overheating of the integrated circuit chip and result in a substantial decrease in the voltage between the power supply terminals. Similar problems can also exist with bipolar drivers including PNP and NPN transistors having series connected emitter collector paths.

In the past, one approach to resolving the problem has involved complicated circuitry which takes into account processing variables in making the integrated circuits, as well as changes that occur to the circuit elements as a result of power supply voltage and temperature variations of the integrated circuit chip carrying the circuitry. Another complicated approach has involved staging a number of field effect transistors. These complicated circuits occupy a significant amount of space on the integrated circuit chip and consume additional power, resulting in possible unnecessary heating of the chip.

There is a prior art circuit wherein conventional capacitors are connected in negative feedback paths to the gate electrodes of opposite conductivity type field effect transistors having series connected source drain paths. A problem with using conventional capacitors is that the slope of the exponential waveform which results in response to a transition being applied to such capacitors decreases substantially as the voltage across the capacitor approaches a target value associated with the DC power supply voltage. Consequently, the use of conventional capacitors is usually incompatible with high frequency operation, such as is associated with integrated circuits operating in excess of a few hundred MHz. In this prior art circuit, both field effect transistors appear to be turned on simultaneously during a transition, resulting in substantial current flow. Another problem with this prior art circuit is that the capacitors are charged and discharged through source drain paths of additional field effect transistors, rather than through resistors.

SUMMARY OF THE INVENTION

In accordance with one aspect of the present invention, a driver circuit comprises an input terminal for connection to a voltage source having first and second levels and a transition between the levels. The driver circuit includes first and second opposite conductivity type transistors, each including a control electrode and a path which is switched on and off between a pair of further electrodes in response to a voltage applied to the control electrode being on opposite sides of a threshold. The paths of the first and second transistors are connected in series across opposite power supply terminals. Circuitry connected between the first terminal and the control electrodes causes the paths of the first and second transistors to be (1) respectively on and off while the voltage source has the first level, and (2) respectively off and on while the voltage source has the second level. At least one switched capacitor connected between the first terminal and the driver prevents the paths of the first and second transistors from being on simultaneously in response to transitions between the first and second levels.

Preferably, the at least one capacitor includes first and second voltage controlled switched capacitors respectively connected to delay coupling of the transitions to the control electrodes of the first and second transistors.

In the preferred embodiment, the first and second opposite conductivity type transistors are opposite conductivity type field effect transistors, that is, a PFET and NFET. In this embodiment, the first and second capacitors are preferably third and fourth field effect transistors having opposite conductivity types from the conductivity types of the first and second transistors, respectively. The gate electrodes of the first and third transistors are connected to each other, and the gate electrodes of the second and fourth transistors are connected to each other. The source drain path of the third transistor is connected to one power supply terminal, while the source drain path of the fourth transistor is connected to the other power supply terminal.

Preferably, the first and second capacitors are charged and discharged by first and second inverter circuits connected to be responsive to the voltage source. Each of the inverter circuits includes a pair of opposite conductivity type transistors each including a control electrode and a path which is switched on and off between a pair of further electrodes in response to the voltage which is applied to the control electrodes being on opposite sides of a threshold. The paths of the transistors of each inverter are connected in series across opposite power supply terminals. Each inverter includes a resistive impedance connected in the paths of the transistors of the particular inverter. The inverters and the resistive impedances thereof are connected so that (1) current flows through the resistive impedance of the first inverter and no current flows through the resistive impedance of the second inverter while the voltage of the source has the first level, and (2) current flows through the resistive impedance of the second inverter and no current flows through the resistive impedance of the first inverter while the voltage of the source has the second level. The foregoing arrangement provides excellent control for switching of the first and second transistors, while minimizing the power requirements of the circuitry.

In the preferred embodiment, wherein the driver circuit is on an integrated circuit chip, the first and second opposite conductivity type transistors are opposite conductivity type field effect transistors, that is, a PFET and NFET and the inverters also preferably include opposite conductivity type field effect transistors (FETs). Preferably, the resistive impedance on the integrated circuit chip is a resistor having a relatively low value that usually cannot be achieved by the source drain impedance of a FET. The low value of the resistor is desirable for high frequency uses because it provides a relatively short delay time. A resistor also has the advantage over a FET source drain path because the resistive impedance of a resistor is not subject to the extensive variations in value as a function of chip processing, voltage and temperature that accompany a source drain path.

Another aspect of the invention is concerned with a method of operating a driver including first and second opposite conductivity type transistors, each including a control electrode and a path between a pair of further electrodes controlled in response to a voltage applied to the control electrode. The paths of the first and second transistors are connected in series across opposite power supply terminals. There is an output terminal between the series connected paths. First and second switched capacitors are respectively connected in shunt with the control electrodes. The method comprises during a first interval: turning on and off the paths of the first and second transistors, respectively, while the second capacitor is charged and the first capacitor is switched off by applying (1) a first voltage having a first value to the control electrode of the first transistor, (2) the first voltage value across the second capacitor, and (3) a second voltage having the first value to the control electrode of the second transistor. During a second interval, the first and second transistors are turned off and on, respectively, while the second capacitor is switched off and the first capacitor is charged by applying (1) the second value of the first voltage to the control electrode of the first transistor, (2) the first voltage value across the first capacitor, and (3) the second value of the second voltage to the control electrode of the second transistor. During an initial portion of a first transitional period between the first and second intervals, the path of the first transistor is turned off while the path of the second transistor is maintained off by changing the first voltage from the first value toward the second value while the first capacitor remains turned off and the second capacitor is charged. During a second portion of the first transitional period, the path of the second transistor is turned on while the path of the first transistor is maintained off by changing the charge on the second capacitor so that there is a change in the value of the second voltage from the first value toward the second value. During an initial portion of a second transitional period between the second and first intervals, the path of the second transistor is turned off while the path of the first transistor is maintained off by changing the second voltage from the second value toward the first value while the second capacitor remains turned off and the first capacitor is charged. During a second portion of the second transitional period the path of the first transistor is turned on while the path of the second transistor is maintained off by changing the charge on the first capacitor so that there is a change in the value of the first voltage from the second value toward the first value.

In the preferred embodiment, the first capacitor is switched off during the second portion of the first transitional period prior to the value of the first voltage, as applied to the control electrode of the first transistor, reaching the first value, and the second capacitor is switched off during the second portion of the second transitional period prior to the value of the second voltage, as applied to the control electrode of the first transistor, reaching the second value. The first and second capacitors are preferably switched on and off in response to the first and second voltages having values on opposite sides of first and second thresholds respectively associated with the first and second capacitors.

The above and still further objects, features and advantages of the present invention will become apparent upon consideration of the following detailed description of a specific embodiment thereof, especially when taken in conjunction with the accompanying drawings.

DETAILED DESCRIPTION OF THE DRAWING

Figure 1:
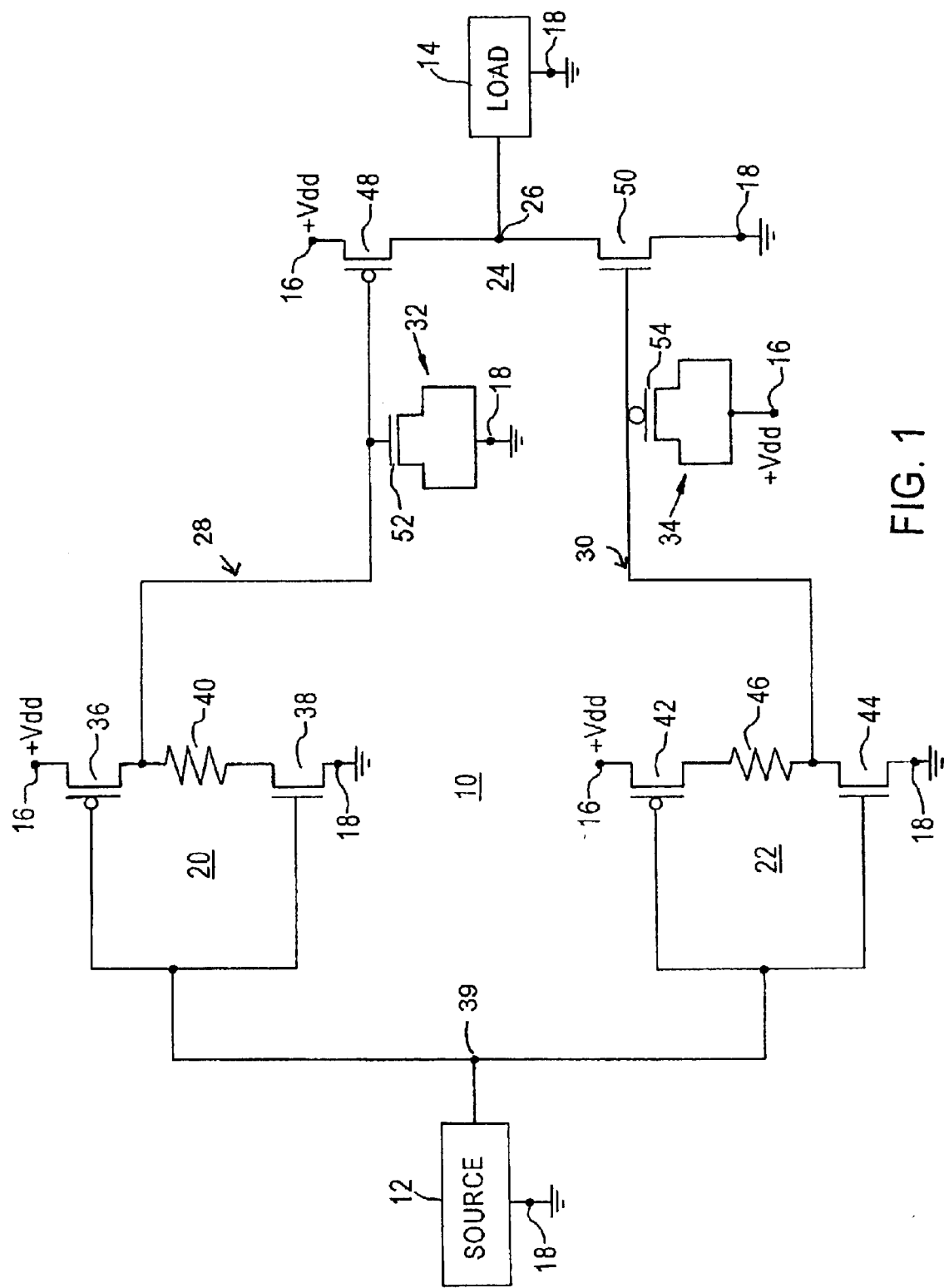
FIG. 1 is a circuit diagram of a preferred embodiment of the present invention.

Reference is now made to FIG. 1 of the drawing wherein driver circuit 10 is illustrated as being connected between bilevel voltage source 12 and load 14. Driver circuit 10, source 12 and load 14 are complementary metal oxide semiconductor (CMOS) circuits on an integrated circuit chip having a positive DC power supply terminal 16, at a potential of +Vdd, and a negative DC power supply terminal 18, at ground potential. The bilevel output of voltage source 12, which can be either a data or clock source, typically switches between potentials of 1.0 Vdd and 0 Vdd, and has positive and negative going short duration transitions between these potentials. Load 14, typically other circuitry on the integrated circuit and/or off chip circuitry, is subject to substantial variations, depending upon the number of circuits in load 14 which are activated at a particular time.

Driver circuit 10 includes inverters 20 and 22, connected to be driven in parallel by the output of source 12. Driver circuit 10 also comprises output stage 24, including output terminal 26 which is connected in a DC circuit to drive load 14. Output stage 24 is connected to be responsive to output voltages of inverters 20 and 22 via DC circuits 28 and 30 which respectively include switched voltage controlled shunt capacitors 32 and 34.

Inverter 20 includes complementary transistors in the form of PFET 36 and NFET 38 having gate electrodes connected to be driven in parallel by the bilevel output of source 12 and source drain paths which are switched on and off in a complementary manner by the voltage applied to the gate electrodes of the PFET and NFET. The source drain paths of PFET 36 and NFET 38 are connected in series with each other and across DC power supply terminals 16 and 18. A resistive impedance, i.e., resistor 40, is connected in series with the source drain paths of PFET 36 and NFET 38, between the drains of the PFET and NFET of inverter 20. The use of resistor 40 as a resistive impedance is advantageous because it (1) enables a lower resistance to be achieved and (2) provides better resistance value stability with regard to variations of integrated circuit temperature and power supply voltage, and integrated chip processing. A first end of DC circuit 28 is connected to a common terminal at one side of resistor 40 and the drain electrode of PFET 36.

Inverter 22 is similar to inverter 20, in that inverter 22 includes PFET 42 and NFET 44 and a resistive impedance in the form of resistor 46. The gate electrodes of PFET 42 and NFET 44 are connected to be driven in parallel by the output voltage of source 12 and the source drain paths of PFET 42 and NFET 44 are connected in series with each other and resistor 46. However, inverter 22 differs from inverter 20 because the common terminal of resistor 46 and the drain of NFET 44 are connected to a first end of DC circuit 30. Inverters 20 and 22 thus can be considered as switching circuits for selectively supplying, to the output terminals thereof, voltages substantially equal to the power supply voltages 1.0 Vdd and 0 Vdd.

Output stage 24 includes PFET 48 and NFET 50 having source drain paths connected in series with each other across DC power supply terminals 16 and 18. The drain electrodes of PFET 48 and NFET 50 have a common connection to output terminal 26 which is connected to load 14. PFET 48 and NFET 50 have gate electrodes respectively connected to the second ends of DC circuits 28 and 30. The gate electrodes of PFET 48 and NFET 50 are respectively connected to first electrodes of shunt capacitors 32 and 34. The second electrode of capacitor 32 is connected to ground DC power supply terminal 18, while the second electrode of capacitor 34 is connected to +Vdd power supply terminal 16. Because of the connections of the electrodes of capacitors 32 and 34 to the gate electrodes of PFET 48 and NFET 50 and to the constant voltages at the power supply terminals 16 and 18, the waveforms across the capacitors are independent of the current that load 14 draws from output stage 24. PFET 48 and NFET 50 have thresholds such that (1) in response to the voltage applied to the gate electrode of PFET 48 being less than and greater than the threshold voltage of the PFET, the PFET source drain path is turned on and off, respectively, and (2) in response to the voltage applied to the gate electrode of NFET 48 being less than and greater than the threshold voltage of the NFET, the NFET source drain path is turned off and on, respectively.

In the preferred embodiment, capacitors 32 and 34 are voltage controlled switched capacitors respectively comprising NFET 52 and PFET 54. One electrode of each of capacitors 32 and 34 respectively comprises the gate electrodes of NFET 52 and PFET 54. The other electrode of each of capacitors 32 and 34 respectively comprises the source drain paths of NFET 52 and PFET 54. The source and drain electrodes of NFET 52 are connected together and to ground terminal 18, while the source and drain paths of PFET 54 are connected together and to +Vdd power supply terminal 16. Each of NFET 52 and PFET 54 includes an insulator between the gate electrode and the source drain path thereof. NFET 52 and PFET 54 have finite capacitance values across the insulators thereof in response to the voltages across the insulators exceeding a threshold value. In response to the voltages across the insulators of NFET 52 and PFET 54 being less than the threshold value, the impedance across each of the insulators can be considered as an open circuit.

The circuitry of FIG. 1, including the thresholds of PFET 48 and NFET 50, is such that the source drain paths of PFET 48 and NFET 50 are never simultaneously on. Consequently, crowbar current cannot flow between power supply terminals 16 and 18 through the source drain paths of PFET 48 and NFET 50. The circuitry of FIG. 1 is also adapted for high-speed operation because of the action of voltage controlled switched capacitors 32 and 34, respectively comprising NFET 52 and PFET 54, and the way the switched capacitors are connected to inverters 20 and 22, as well as to the gate electrodes of PFET 48 and NFET 50.

Figure 2:
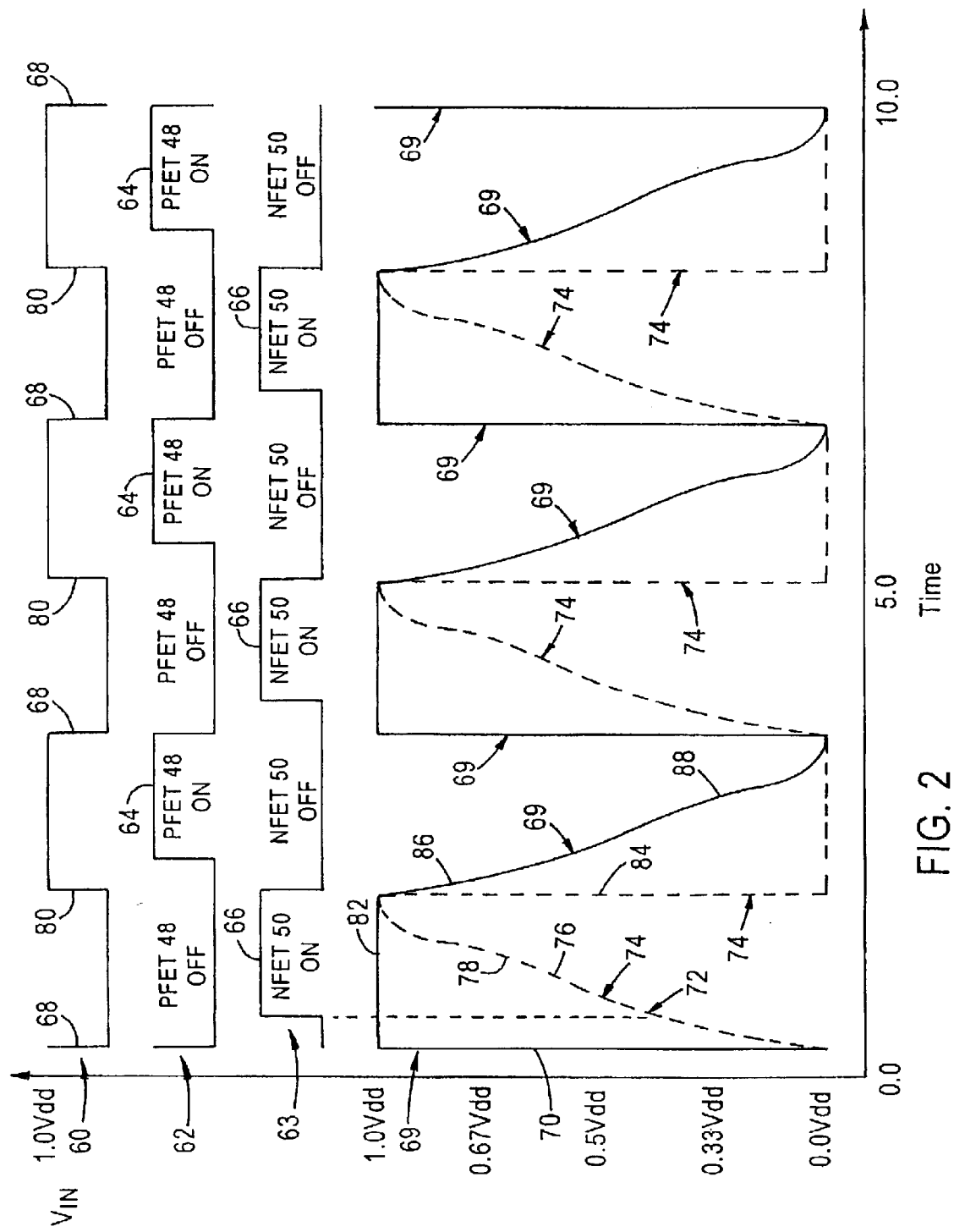
FIG. 2 includes a series of waveforms helpful in describing the operation of the circuit of FIG. 1.

Reference is now made to FIG. 2 of the drawing which is helpful in describing the operation of the circuit of FIG. 1. The output voltage of source 12, indicated by bilevel waveform 60, is illustrated as having a 50-50 duty cycle, although it is to be understood that the output of source 12 can have any suitable duty cycle for a clock or data source.

During the half cycles of source 12 when the output voltage of the source has a value of 1.0 Vdd, NFETs 38 and 44 are turned on and PFETs 36 and 42 are turned off. Consequently, a voltage approximately equal to the ground voltage at terminal 18 is supplied to the first end of DC circuit 28 (at the drain of PFET 36) through the low impedance, turned on source drain path of NFET 38 and resistor 40. At the same time, the ground voltage at terminal 18 is supplied to the first, input end of DC circuit 30 (at the drain of NFET 44) through the low impedance, turned on source drain path of NFET 44. Just before the end of the half cycles when the output voltage of source 12 has a value of 1.0 Vdd, inverters 20 and 22 apply low voltages, substantially equal to the voltage at ground terminal 18, to the gate electrodes of PFET 48 and NFET 50, causing the PFET and NFET to be respectively turned on and off. In addition, at this time there is virtually no voltage across the insulator of NFET 52 because the gate electrode thereof and the source drain path thereof are both substantially at ground potential, resulting in NFET 52 being turned off and capacitor 32 being switched out of the circuit. In contrast, because (1) NFET 44 is turned on, causing the input of DC path 30 to be at substantially at ground, i.e., 0 Vdd, and (2) the source drain path of PFET 54 is at 1.0 Vdd, there is a voltage substantially equal to 1.0 Vdd across the insulator of turned on PFET 54 which has a finite capacitance value.

During the half cycles of source 12 when the output voltage of the source has a value of 0 Vdd, NFETs 38 and 44 are turned off and PFETs 36 and 42 are turned on. Consequently, the 1.0 Vdd voltage at terminal 16 is supplied to the first, input end of DC circuit 28 (at the drain of PFET 36) through the low impedance, turned on source drain path of PFET 36. At the same time, a voltage approximately equal to the 1.0 Vdd voltage at terminal 16 is supplied to the first end of DC circuit 30 (at the drain of NFET 44) through the low impedance, turned on source drain path of PFET 42 and resistor 46. Just before the end of the half cycles when the output voltage of source 12 has a value of 0 Vdd, inverters 20 and 22 apply high voltages, substantially equal to the 1.0 Vdd voltage at power supply terminal 16, to the gate electrodes of PFET 48 and NFET 50, causing the PFET and NFET to be respectively turned off and on. Also, at this time there is virtually no voltage across the insulator of PFET 54 because the gate electrode thereof and the source drain path thereof are both substantially at 1.0 Vdd, resulting in PFET 54 being turned off and capacitor 34 being switched out of the circuit. In contrast, because (1) PFET 36 is turned on, causing the input of DC path 28 to be substantially at 1.0 Vdd, and (2) the source drain path of NFET 52 is at ground potential, there is a voltage substantially equal to 1.0 Vdd across the insulator of turned on NFET 52, which has a finite capacitance value.

As indicated by waveforms 62 and 63, PFET 48 is turned on during intervals 64, while NFET 50 is turned on during intervals 66; intervals 64 and 66 alternate with and are mutually exclusive of each other.

At the beginning of and during the short duration negative going transitions 68 of the voltage of source 12, from 1.0 Vdd to 0 Vdd, as indicated by waveform 60, PFET 36 rapidly goes from an off to an on condition while NFET 38 rapidly goes from an on to an off condition. Because capacitor 32 is essentially an open circuit at this time, the voltage at the drain of PFET 36, at the input of DC circuit 28, changes rapidly in the positive direction, so that the voltage applied to the gate of PFET 48, indicated by waveform 69, changes rapidly, as indicated by waveform portion 70, from a value substantially equal to 0 Vdd to a value substantially equal to 1.0 Vdd. This results in PFET 48 changing rapidly from an on condition to an off condition, as indicated by the negative going transitions at the ends of intervals 64 of waveform 62, but has no immediate effect on the voltage across switched off capacitor 32.

At the beginning of and during negative going transitions 68, PFET 42 rapidly goes from an off condition to an on condition while NFET 44 rapidly goes from an on to an off condition. Because capacitor 34 is fully charged to 1.0 Vdd at the beginning of negative going transitions 68, the current flow through resistor 46 does not change suddenly, but increases exponentially at a rate primarily determined by the values of resistor 46 and the finite capacitance of capacitor 34. The exponential increase in the current through resistor 46 causes the voltage across capacitor 34 and between the gate and source of NFET 50 to increase exponentially, as indicated by portion 72 of waveform 74, which represents the voltage across the gate and source electrodes of NFET 50.

During the beginning of waveform portion 72, the voltage across the gate of NFET 50 is less than the threshold of the NFET, which is assumed in FIG. 2 to be 0.33 Vdd. Thus, NFET 50 remains off for a predetermined interval subsequent to negative going transition 68. During this predetermined interval, both PFET 48 and NFET 50 are off to prevent crowbar current from flowing through the source drain paths thereof between power supply terminals 16 and 18. In response to the voltage across the gate of NFET 50 crossing the threshold of that NFET during waveform portion 72, NFET 50 is turned on, as indicated by the positive going transition at the beginning of intervals 66 of waveform 63, whereby current can flow between load 14 and NFET 50 during intervals 66.

As exponential current continues to flow through capacitor 34 and resistor 46 while the voltage of source 12 equals 0 Vdd, there is a gradual decrease in the slope of the voltage applied to the gate of NFET 50, as indicated by portion 76 of waveform 74. To enable the target voltage of 1.0 Vdd to be quickly achieved, PFET 54 is switched off during waveform portion 76 at the threshold of the PFET, illustrated in FIG. 2 to be at 0.67 Vdd. As result of PFET 54 being switched off, the voltage at the gate of NFET 50 increases more rapidly, as indicated by portion 78 of waveform 74, such that there is a "kink" in waveform 74 between portions 76 and 78. Waveform 74 reaches its target value of 1.0 Vdd shortly before the occurrence of positive going transition 80 of waveform 60.

During the entire half cycle of source 12 while the source is applying a voltage of 0 Vdd to driver circuit 10 the voltage at the gate of PFET 48 remains substantially at 1.0 Vdd, as indicated by waveform portion 82 of waveform 69. This is because PFET 36 couples the 1.0 Vdd voltage at terminal 16 to the gate of PFET 48.

In response to positive going transitions 80 of waveform 60, complementary operations occur in driver circuit 10 relative to the operations which occur in response to the negative going transitions 68. Hence, the current flowing through resistor 46 suddenly decreases, as does the voltage at the gate of NFET 50, as indicated by portion 84 of waveform 74. Thereby, NFET 50. suddenly goes from an on to an off state, as indicated by the negative transitions of waveform 63 at the end of intervals 66. In response to the positive going transition 80, the voltage at the gate of PFET 48 decreases exponentially as indicated by portion 86 of waveform 69. PFET 48 remains off until its threshold is crossed, which is assumed in FIG. 2 to be at 0.67 Vdd. In response to waveform portion 86 crossing the 0.67 Vdd threshold, PFET 48 is turned on, as indicated by the positive going transitions of waveform 62 at the beginning of intervals 64. The voltage across capacitor 32 continues to decrease exponentially until the threshold of NFET 52 is reached, which is assumed to be at 0.33 Vdd in FIG. 2. In response to the voltage across capacitor 32 crossing the threshold of capacitor 32, the capacitor is switched off and the slope of waveform 68 increases, as indicated by waveform portion 88. The voltage across capacitor 32 and at the gate of PFET 48 reach a target value substantially equal to 0 Vdd shortly before the next negative going transition 68 of waveform 60. Operation continues in this matter.

While there has been described and illustrated a specific embodiment of the invention, it will be clear that variations in the details of the embodiment specifically illustrated and described may be made without departing from the true spirit and scope of the invention as defined in the appended claims. For example, the principles of the invention are applicable to bipolar transistors and varactor diodes, although the use of FETs for the transistors and switched capacitors is particularly advantageous for integrated circuits.

We claim:

1. A circuit comprising a first terminal for connection to a voltage source having first and second levels and a transition between the levels, a driver including first and second opposite conductivity type transistors, each including a control electrode and a path switched on and off in response to a voltage applied to the control electrode being on opposite sides of a threshold level, the first and second transistor paths being connected in series across opposite power supply terminals, an output terminal between the paths, circuitry connected between the first terminal and the control electrodes for causing the first level and (b) off and on while the voltage source has the second level, said circuitry including at least one voltage responsive switchable capacitor connected between the first terminal and the driver for preventing the paths of the first and second transistors from being on simultaneously during transitions between the first and second levels, the at least one capacitor including first and second voltage controllable switchable capacitors respectively connected to delay coupling of the transitions to the control electrodes of the first and second transistors, the first and second capacitors being respectively connected between the control electrodes of the first and second transistors and first and second power supply terminals of the circuit and are such that (a) the first capacitor is arranged to have a finite capacitance value on a first side of a first voltage threshold and a substantially open circuit on a second side of the first threshold, and (b) the second capacitor is arranged to have a finite capacitance value on a second side of a second voltage threshold and a substantially open circuit on a first side of the second threshold, the first and second thresholds differing from each other and being between the first and second levels, the first and second transistors being respectively a PFET and an NFET and the first and second capacitors being respectively an NFFT and a PFFT.

2. A circuit comprising a first terminal for connection to a voltage source having first and second levels and a transition between the levels, a driver including first and second opposite conductivity type transistors, each including a control electrode and a path switched on and off in response to a voltage applied to the control electrode being on opposite sides of a threshold level, the first and second transistor paths being connected in series across opposite power supply terminals, an output terminal between the paths, circuitry connected between the first terminal and the control electrodes for causing the first and second transistor paths to be respectively (a) on and off while the voltage source has the first level and (b) off and on while the voltage source has the second level, said circuitry including at least one voltage responsive switchable capacitor connected between the first terminal and the driver for preventing the paths of the first and second levels, the at least one capacitor including first and second voltage controllable switchable capacitors respectively connected to delay coupling of the transitions to the control electrode of the first and second transistors, said first and second capacitors being respectively connected between the control electrodes of the first and second transistors and first and second power supply terminals of the circuit and are such that (a) the first capacitor is arranged to have a finite capacitance value on a first side of a first voltage threshold and a substantially open circuit on a second side of the first threshold and (b) the second capacitor is arranged to have a finite capacitance value on a second side of a second voltage threshold and a substantially open circuit on a first side of the second threshold, the first and second thresholds differing from each other and being between the first and second levels, the circuitry including first and second resistive elements respectively connected to supply current to the first and second capacitors in response to the voltage at the first terminal, the first and second transistors respectively being PFET and NFET and the first and second capacitors being respectively and NFET and PFET.

3. The circuit of claim 2 wherein the first and second transistors, the first and second resistive elements and the first and second capacitors are included on an integrated circuit chip, the first and second resistive elements including first and second resistors on the chip.

4. A circuit comprising a first terminal for connection to a voltage source having first and second levels and a transition between the levels, a driver including first and second opposite conductivity type transistors, each including a control electrode and a path switched on and off in response to a voltage applied to the control electrode being on opposite sides of a threshold level, the first and second transistor paths being connected in series across opposite power supply terminals, an input terminal between the paths, circuitry connected between the first terminal and the control electrodes for causing the first and second transistor paths to be respectively (a) on and off while the voltage source has the first level and (b) off and on while the voltage source has the second level, said circuitry including at least one voltage responsive switchable capacitor connected between the first terminal and the driver for preventing the paths of the first and second transistors from being on simultaneously during transitions between the first and second levels, the at least one capacitor including first and second voltage controllable switchable capacitors respectively connected to delay coupling of the transitions to the control electrodes of the first and second transistors, the circuitry including first and second inverters each having (a) an input terminal for enabling the first and second inverters to be simultaneously responsive to the voltage at the first terminal and the (b) an output terminal, the output terminal of the first inverter being connected to supply current via a first DC path to the first capacitor and the control electrode of the first transistor, the output terminal of the second inverter being connected to supply current via a second DC path to the second capacitor and the control electrode of the second transistor, the first and second transistors being field effect transistors, the first and second inverters comprising field effect transistors, and the first and second capacitors comprising field effect devices, all of the field effect transistors being included on an integrated circuit chip including first and second resistors respectively connected with the first and second field effect transistors and the first and second inverters, the first and second resistors being respectively included in the first and second inverters, the first and second transistors being respectively a PFET and an NFET, each of the inverters including a PFET and an NFET, the PFET and NFET of each inverter having a source drain path and a gate electrode having a connection to the first terminal so that the gate electrodes of the PFETs and NFETs of the inverters are driven in parallel by the voltage at the input terminal, the output terminal or each of the inverters being between the source drain paths of the PFET and NFET thereof, the first resistor being connected between the source drain path of the NFET of the first inverter and the output terminal of the first inverter, the second resistor being connected between the source drain path of the PFET of the second inverter and the output terminal of the second inverter, the first and second capacitors respectively including an NFET and PFET.

5. The circuit of claim 4 wherein the NFET and PFET included in the first and second capacitors respectively have different first and second thresholds between the first and second levels, the NFET included in the first capacitor having a finite capacitance value for voltages below the first threshold and being a substantially open circuit for voltages greater than the first threshold, the PFET included in the second capacitor having a finite capacitance value for voltages greater than the second threshold and being a substantially open circuit for voltages less than the second threshold, the first threshold being greater than the second threshold.

* * * * *